United States Patent
Pak et al.

(10) Patent No.: US 7,892,519 B2
(45) Date of Patent: Feb. 22, 2011

(54) RAPID SYNTHESIS AND SIZE CONTROL OF CHALCOPYRITE-BASED SEMI-CONDUCTOR NANOPARTICLES USING MICROWAVE IRRADIATION

(75) Inventors: Joshua J. Pak, Pocatello, ID (US);
Joseph S. Gardner, Pocatello, ID (US);
Endrit Shurdha, Salt Lake City, UT (US); Rene G. Rodriguez, Pocatello, ID (US); Lisa D Lau, Idaho Falls, ID (US)

(73) Assignee: Idaho State University, Pocatello, ID (US)

( * ) Notice: Subject to any disclaimer, the term of this patent is extended or adjusted under 35 U.S.C. 154(b) by 459 days.

(21) Appl. No.: 11/957,108

(22) Filed: Dec. 14, 2007

(65) Prior Publication Data

US 2011/0017017 A1    Jan. 27, 2011

Related U.S. Application Data

(60) Provisional application No. 60/875,221, filed on Dec. 14, 2006.

(51) Int. Cl.
C01B 17/00    (2006.01)
(52) U.S. Cl. .................... 423/511; 423/561.1; 977/813
(58) Field of Classification Search ................ 423/511, 423/561.1; 977/813
See application file for complete search history.

(56) References Cited

U.S. PATENT DOCUMENTS

| | | | |
|---|---|---|---|
| 4,906,290 A | 3/1990 | Worner | |
| 5,445,847 A | 8/1995 | Wada et al. | |
| 5,858,120 A | 1/1999 | Nakagawa et al. | |
| 6,127,202 A | 10/2000 | Kapur et al. | |
| 6,355,874 B1 | 3/2002 | Yagi et al. | |
| 7,575,699 B2 * | 8/2009 | Strouse et al. | 264/5 |
| 2004/0055634 A1 | 3/2004 | Yamaguchi | |
| 2006/0061017 A1 * | 3/2006 | Strouse et al. | 264/489 |

OTHER PUBLICATIONS

Bahnemann, D.W. "Ultrasmall metal oxide particles: preparation, photophysical characterization, and photocatalytic properties". *Israel J. Chem.* 1993, 33, 115-136.
Banger, K.K.; Cowen J.E.; Hepp, A.F. "Synthesis and characterization of the first liquid single-source precursors for the deposition of ternary chalcopyrite (CuInS$_2$) thin film materials". *Chem Mater.* 2001, 13 (11), 3827-3829.
Banger, K.K.; Harris, J.D.; Cowen, J.E.; Hepp, A.F. "Facile modulation of single source precursors: the synthesis and characterization of single source precursors for deposition of ternary chalcopyrite materials". *Thin Solid Films.* 2002, 403-404, 390-395.
Banger, K.K.; Jin, M.H.-C.; Harris; J.D.; Fanwick, P.E.; Hepp, A.F. "A new facile route for the preparation of single-source precursors for bulk, thin-film, and nanocrystallite I-III-VI semiconductors". *Inorg Chem.* 2003, 42, (24), 7713-7715.

Cardellicchio, N.; Di Leo, A.; Giandomencio, S.; Santoro, S. "Optimization of microwave digestion for mercury determination in marine biological samples by cold vapour atomic absorption spectrometry". *Annali di Chimica.* 2006, 96 (3-4), 159-165.
Carro, N.; Garcia, I.; Ignacio, M.; Mouteira, A. "Microwave-assisted solvent extraction and gas chromatography ion trap mass spectrometry procedure for the determination of persistent organochlorine pesticides (POPs) in marine sediment". *Anal Bioanal Chem.* 2006, 385 (5), 901-909.
Castro, S.L.; Bailey, S. G.; Raffaelle, R.P.; Banger, K.K.; Hepp, A.F. "Nanocrystalline chalcopyrite materials (CuInS$_2$ and CuInSe$_2$) via low-temperature pyrolysis of molecular single-source precursors". *Chem Mater.* 2003, 15 (16), 3142-3147.
Castro, S.L.; Bailey, S.G.; Raffaelle, R.P.; Banger, K.K.; Hepp, A.F. "Synthesis and characterization of colloidal CuInS$_2$ nanoparticles from a molecular single-source precursor". *J Phys Chem B.* 2004, 108, 12429-12435.
Choi, S.H.; Kim, E.G.; Hyeon, T. "One-pot synthesis of copper-indium, sulfide nanocrystal heterostructures with acorn, bottle, and larva shapes". *J Am Chem Soc* 2006, 128 (8), 2520-2521.
Domini, C.E.; Hidalgo, M.; Marken, F; Canals, A. "Comparison of three optimized digestion methods for rapid determination of chemical oxygen demand: Closed microwaves, open microwaves and ultrasound irradiation". *Anal Chim Acta.* 2006, 561 (1-2), 210-217.
Dutta, D.P.; Sharma, G. "A facile route to the synthesis of CuInS$_2$ nanoparticles". *Mater Lett.* 2006, 60 (19), 2395-2398.
Gamallo-Lorenzo, D.; Barciela-Alonso, M.; Moreda-Pineiro, A.; Barmejo-Barrera, A.; Barmejo-Barrera, P. "Microwave-assisted alkaline digestion combined with microwave-assisted distillation for the determination of iodide and total iodine in edible seaweed by catalytic spectrophotometry". *Anal Chim Acta.* 2005, 542 (2), 287-295.
Garcia-Vidal, J.A.; Duran-Valle, C.J.; Ferrera-Escudero, S. "Green chemistry: Efficient epoxides ring-opening with I-butanol under microwave irradiation". *Appl Surf Sci.* 2006, 252 (17), 6064-6066.
Gratzel, M. "Perspectives for dye-sensitized nanocrystalline solar cells" *Prog. Photovot Res Appl.* 2000, 8, 171-185.
Grisaru, H.; Palchik, O.; Gedanken, A. "Microwave-assisted polyol synthesis of CuInTe$_2$ and CuInSe$_2$ nanoparticles". *Inorg Chem.* 2003, 42, 7148-7155.
Hayes, B.L. "Recent advances in microwave-assisted synthesis". *Aldrichimica Acta.* 2004, 37 (2), 66-77.
Hirpo, W; Dhingra. S.; Sutorik, A.C.; Kanatzidis, M.G. "Synthesis of mixed copper-indium chalcogenolates: Single-source precursors for the photovaltic materials CuInQ$_2$ (Q=S, Se)". *J. Am. Chem. Soc.* 1993, 115 (4), 1597-1599.

(Continued)

*Primary Examiner*—Timothy C Vanoy
(74) *Attorney, Agent, or Firm*—Pedersen and Company, PLLC; Ken J. Pedersen; Barbara S. Pedersen (57) ABSTRACT

CuInS$_2$ nanoparticles have been prepared from single source precursors via microwave irradiation. Also, CuInGaS$_2$ alloy nanoparticles have been prepared. Microwave irradiation methods have allowed an increase in the efficiency of preparation of these materials by providing increased uniformity of heating and shorter reaction times. Nanoparticle growth has been controlled in the about 1 to 5 nm size range by variation of thiolated capping ligand concentrations as well as reaction temperatures and times. Investigation of the photophysical properties of the colloidal nanoparticles has been performed using electronic absorption and luminescence emission spectroscopy. Qualitative nanoparticles sizes have been determined from the photoluminescence (PL) data and compared to TEM images.

2 Claims, 4 Drawing Sheets

OTHER PUBLICATIONS

Huynh, W.U.; Peng, X.; Alivisatos, A.P. "CdSe nanocrystal rods/poly (3-hexylthiophene) composite photovoltaic devices". *Adv. Mater.* 1999, 11 (11), 923-927.

Huynh, W.U.; Dittmer, J.J.; Alivisatos, A.P. "Hybrid nanorod-polymer solar cells". *Science.* 2002, 295, 2425-2427.

Luque, A.; Marti, A. "Increasing the efficiency of ideal solar cells by photon induced transitions at intermediate levels". *Phys. Rev. Lett.* 1997, 78 (26), 5014-5017.

Marcinkevicius, S.; Leon, R.:Cechavicius, B.; Siegert, J.; Lobo, C.; Magness, B.; Taylor, W. *Physica B.* 2002, 314, 203-206.

Murali A.; Barve, A.; Leppert, V.J.; Risbud, S.H.; Kennedy, I.M.; Lee, H.W.H. "Synthesis and characterization of indium oxide nanoparticles". *Nano Lett.* 2002, 1 (6), 287-289.

Nairn, J.J.; Shapiro, P.J.; Twamley, B.; Pounds, T.; von Wandruszka, R.; Fletcher, T.R.; Williams, M.; Wang, C.; Norton, M.G. "Preparation of ultrafine chalcopyrite nanoparticles via the photochemical decomposition of molecular single-source precursors". *Nan Lett.* 2006, 6 (6), 1218-1223.

Navarro, P.; Raposo, J.C.; Arana, G.; Etxebarria, N. "Optimisation of microwave assisted digestion of sediments and determination of Sn and Hg". *Anal Chim Acta.* 2006, 566 (1), 37-44.

Nüchter, M.; Müller, U.; Ondruschka, B.; Tied, A.; Lautenschläger, W. "Microwave-assisted chemical reactions". *Chem Eng Technol.* 2003, 26 (12), 1207-1216.

Nuchter, M.; Ondruschka, B.; Bonrath, W.; Gum, A. "Microwave assisted synthesis—a critical technology overview". *Green Chem.* 2004, 6 (3), 128-141.

Pak, J.J.; Mayo, J.L.; Shurdha, E. "An efficient synthesis of 4, 4',5,5'-tetraiododibenzo-24-crown-8 and its highly conjugated derivatives". *Tet Lett.* 2005, 47 (2), 233-237.

Perozo-Rondon, E.; Costarrosa, L.; Martin-Aranda, R.M.; Rojas-Cervantes, M.L.; Vicente-Rodriguez, M.A. "Microwave enhanced synthesis of N-propargyl derivatives of imidazole: A green approach for the preparation of fungicidal compounds". *Appl Surf Sci* 2006, 252 (17), 6067-6070.

Sobolev, N.A.; Cavaco, A.; Carmo, M.C.; Grundmann, M.; Heinrichsdorff, F.; Bimberg, D. "Enhanced radiation hardness of InAs/GaAs quantum dot structures". *Phys. Stat. Sol B* 2001, 224 (1), 93-96.

Tang, Z.; Wang, Y.; Kotov, N.A. "Semiconductor nanoparticles on solid substrates: film structure, intermolecular interactions, and polyelectrolyte effects". *Langmuir.* 2002, 18 (18), 7035-7740.

Walters, R.J.; Summers, G.P.; Messenger, S.R.; Freundlich, A.; Monier, C.; Newman, F. "Radiation hard multi-quantum well InP/InAsP solar cells for space applications". *Prog. Photovolt: Res. Appl.* 2000, 8, 349-354.

Wang, Y.; Herron, N. "Nanometer-sized semiconductor clusters: materials synthesis, quantum size effects, and photophysical properties". *J Phys Chem.* 1991, 95 (2), 525-532.

Wei, Q.; Mu, J. "Synthesis of $CuInS_2$ nanocubes by a wet chemical process". *J Disp Sci Tech.* 2005 26 (5), 555-558.

Zhang, X.; Hayward, D.O. "Applications of microwave dielectric heating in environment-related heterogeneous gas-phase catalytic systems". *Inorg Chim Acta.* 2006, 359 (11), 3421-3433.

Zhu, J.; Plachik, O.; Chen, S.; Gedanken, A. "Microwave assisted preparation of CdSe, PbSe, and $Cu_{2-x}$ Se nanoparticles". *J. Phys. Chem. B.* 2000, 104 (31), 7344-7347.

Tomalia, D.A. "Birth of a new macrocmolecular architecture: Dendrimers as quantized building blocks for nanoscale synthetic organic chemistry". *Aldrichimica ACTA.* 2004, 37 (2), 39-57.

Gerbec, J.A.; Magana, D.; Washington, A.; Strouse, G.F. "Microwave-enhanced reaction rates for nanoparticle synthesis". *J. Am. Chem. Soc.* 2005, 127, 15791-15800.

Kim, K.; Chun, Y; Park, B.; Yoon, K. "Synthesis of $CuInSe_2$ and $CuInGaSe_2$ nanoparticles by solvothermal route". *Materials Science Forum.* 2004, 449-452, 273-276.

* cited by examiner

Fig. 3 (a) HRTEM micrographs of sample #6, (b) Magnification of nanoparticles, and (c) Selected Area Diffraction (SAD)

Fig. 4 (a) Histogram of sample #2 nanoparticles and (b) HRTEM images of nanoneedles

RAPID SYNTHESIS AND SIZE CONTROL OF CHALCOPYRITE-BASED SEMI-CONDUCTOR NANOPARTICLES USING MICROWAVE IRRADIATION

This application claims priority of our prior, co-pending provisional patent application, Ser. 60/875,221, filed on Dec. 14, 2006, entitled "Rapid synthesis and size control of CuInS$_2$ semi-conductor nanoparticles using microwave irradiation" which is incorporated herein by reference.

BACKGROUND OF THE INVENTION

1. Field of the Invention

The invention relates to nanoparticles of chalcopyrites and methods of making the same. Invented chalcopyrite-based nanocrystalline or quantum dot materials may be important components of next-generation photovoltaic (PV) devices, for example, in solar cells that may feature greatly-increased solar-energy-conversion compared to conventional, silicon-based solar cell technology. The inclusion of nanocrystalline chalcopyrite semi-conductors according to embodiments of the invention may improve efficiency of photon conversion, for example, in quantum dot solar cells, may enable low-cost deposition of thin films, provide sites for exciton dissociation, and pathways for electron transport. Chalcopyrite quantum dots according to embodiments of the invention may be more resistant to degradation from electron, proton, and alpha particle radiation that the corresponding bulk materials, which resistance is a requirement of use in space solar cells. Embodiments of the invention provide rapid synthesis and size control methods for producing CuInS$_2$, and other alloys thereof, semi-conductor nanoparticles using microwave irradiation.

2. Related Art

Since the 1970's with the widespread availability and use of the microwave oven, microwave irradiation has been tested for various uses in chemistry. Analytical chemistry has found microwave irradiation useful in determining the composition of petroleum, sediments, water, seaweed, and marine biological samples by digestion. Organic chemists have used microwave technology to assist in numerous chemical reactions since the publication of the forerunner articles in microwave-assisted organic reactions. Several key organic reactions such as organometallic, Michael, condensation, C—H bond activation, halogenation, nitration, macrocycle syntheses, coupling, ring-opening, alkylation, and acetylation reactions have seen dramatic increases in rate and efficiency using microwave-assisted techniques.

Growth of nanoparticles is highly dependent on the thermodynamic and kinetic barriers of the reaction. Conventional thermolysis relies on the conduction of blackbody radiation to drive the reaction, using the reaction vessel as an intermediary for the transfer of energy. This often causes sharp thermal gradients that create non-uniform thermal conditions resulting in non-uniform nucleation and particle growth.

Nanoparticles of the form Cu-III-VI$_2$ have been made by the decomposition of single-source precursors ("SSPs"), solid-state reactions of the metal powders, and multiple-source precursors. Traditionally, the formation of the nanoparticles from SSP is facilitated by thermolysis of the precursor, although there have been reports of the nanoparticles formed by photolysis. Despite the potential benefits of replacing traditional thermolysis with microwave irradiation, only a few types of nanoparticles have been prepared via microwave radiation thus far, including CdSe, PbSe, Cu$_{2-x}$Se, CuInTe$_2$, and CuInSe$_2$ nanoparticles from metal salts and CdSe, InP, and InGaP from respective SSPs.

REFERENCES

Bahnemann D W (1993) Ultrasmall metal oxide particles: preparation, photophysical characterization, and photocatalytic properties. Israel J. Chem 33:115-136.

Banger K K, Cowen J. Hepp A F (2001) Synthesis and characterization of the first liquid single-source precursors for the deposition of ternary chalcopyrite (CuInS2) thin film materials. Chem Mater 13(11):3827-3829.

Banger K K, Harris J D, Cowen J E, Hepp A F (2002) Facile modulation of single source precursors: the synthesis and characterization of single source precursors for deposition of ternary chalcopyrite materials. Thin Solid Films 403-404:390-395.

Banger K K, Jin MHC, Harris J D, Fanwick P E, Hepp A F (2003) A new facile route for the preparation of single-source precursors for bulk, thin-film, and nanocrystallite I-III-VI semiconductors. Inorg Chem 42(24):7713-7715.

Cardellicchio N, Di Leo A, Giandomencio S, Santoro S (2006) Optimization of microwave digestion for mercury determination in marine biological samples by cold vapour atomic absorption spectrometry. Annali di Chimica 96(3-4):159-165.

Carro N, Garcia I, Ignacio M, Mouteira A (2006) Microwave-assisted solvent extraction and gas chromatography ion trap mass spectrometry procedure for the determination of persistent organochlorine pesticides (POPs) in marine sediment. Anal Bioanal Chem 385(5):901-909.

Castro S L, Bailey S g, Raffaelle R P, Banger K K, Hepp A F (2003) Nanocrystalline chalcopyrite materials (CuInS2 and CuInSe2) via low-temperature pyrolysis of molecular single-source precursors. Chem Mater 15:3142-3147.

Castro S L, Bailey S G, Raffaelle R P, Banger K K, Hepp A F (2004) Synthesis and characterization of colloidal CuInS2 nanoparticles from a molecular single-source precursor. J Phys Chem B 108:12429-12435.

Choi S H, Kim E G, Hyeon T (2006) One-pot synthesis of copperindium, sulfide nanocrystal heterostructures with acorn, bottle, and larva shapes. J Am Chem Soc 128(8): 2520-2521.

Domini C E, Hidalgo M, Marken F, Canals A (2006) Comparison of three optimized digestion methods for rapid determination of chemical oxygen demand: Closed microwaves, open microwaves and ultrasound irradiation. Anal Chim Acta 561(1-2):210-217.

Dutta D P, Sharma G (2006) A facile route to the synthesis of CuInS2 nanoparticles. Mater Lett 60(19):2395-2398.

Gamallo-Lorenzo D, Barciela-Alonso M, Moreda-Pineiro A, Barmejo-Barrera A, Barmejo-Barrera P (2005) Microwave-assisted alkaline digestion combined with microwave-assisted distillation for the determination of iodide and total iodine in edible seaweed by catalytic spectrophotometry. Anal Chim Acta 542(2):287-295.

Garcia-Vidal J A, Duran-Valle C J, Ferrera-Escudero S (2006) Green chemistry: efficient epoxides ring-opening with I-butanol under microwave irradiation. Appl Surf Sci 252(17):6064-6066.

Gerbec J A, Magana D, Washington A, Strouse G F (2005) Microwave-enhanced reaction rates for nanoparticle synthesis, J Am Chem Soc 127:15791-15800.

Grisaru H, Palchik O, Gedanken A (2003) Microwave-assisted polyol synthesis of CuInTe2 and CuInSe2 nanoparticles. Inorg Chem 42:7148-7155.

Hayes B L (2004) Aldrichimica Acta 37(2):66-77.

Hirpo W, Dhigra S, Sutorik A C, Kanatzidis M G (1993) Synthesis of mixed copper-indium chalcogenolates. Single-source precursors for the photovaltic materials CuInQ2 (Q=S, Se). J Am Chem Soc 115(4):1597-1599.

Murali A, Barve A, Leppert V J, Risbud S H, Kennedy I M, Lee H W H (2001) Synthesis and characterization of indium oxide nanoparticles. Nano Lett 1:287-289.

Nairn J J, Shapiro P J, Twamley B, Pounds T, von Wandruszka R, Fletcher T R, Williams M, Wang C, Norton M G (2006) Preparation of ultrafine chalcopyrite nanoparticles via the photochemical decomposition of molecular single-source precursors. Nan Lett 6(6):1218-1223.

Navarro P, Raposo J C, Arana G, Etxebarria N (2006) Optimisation of microwave assisted digestion of sediments and determination of Sn and Hg. Anal Chim Acta 566(1):37-44.

Nuechter M, Mueller U, Ondruschka B, Tied A, Lautenschlaeger W (2003) Microwave-assisted chemical reactions. Chem Eng Technol 26(12):1207-1216.

Nuechter M, Ondruschka B, Bonrath W, Gum A (2004) Microwave assisted synthesis—a critical technology overview. Green Chem 6(3):128-141.

Pak J J, Mayo J I, Shurdha E (2005) An efficient synthesis of 4, 4',5,5'-tetraiododibenzo-24-crown-8 and its highly conjugated derivatives. Tet Lett 47(2):233-237.

Perozo-Rondon E, Costarrosa L, Martin-Aranda R M, Rojas-Cervantes M L, Vicente-Rodriguez M A (2006) Microwave enhanced synthesis of N-propargyl derivatives of imidazole. Appl Surf Sci 252(17):6067-6070.

Tang Z, Wang Y, Kotov N A (2002) Semiconductor nanoparticles on solid substrates: film structure, intermolecular interactions, and polyelectrolyte effects. Langmuir 18(18): 7035-7740.

Wang Y, Herron N (1991) Nanometer-sized semiconductor clusters: materials synthesis, quantum size effects, and photophysical properties. J Phys Chem 95(2):525-532.

Wei Q, Mu J (2005) Synthesis of CuInS2 nanocubes by a wet chemical process. J Disp Sci Tech 26(5):555-558.

Zhang X, Hayward D O (2006) Applications of microwave dielectric heating in environment-related heterogeneous gas-phase catalytic systems. Inorg Chim Acta 359(11): 3421-3433.

Zhu J, Plachik O, Chen S, Gedanken A J (2000) Microwave assisted preparation of CdSe, PbSe, and Cu2-xSe nanoparticles. J Phys Chem B 104(31):7344-7347.

Zischka M, Kettisch P, Kainrath P (1998) Microwave-assisted digestion of plastic scrap: basic considerations and chemical approach. At Spectrosc 19(6):223-227.

SUMMARY OF THE INVENTION

Interest in using microwave irradiation for preparing nanoparticles stems from potential improved yields and potential narrower distributions of particles sizes. Microwave-assisted growth of nanoparticles is generally favorable over traditional thermolysis because microwave irradiation overcomes local intermediaries and increases the microscopic temperature of the reaction, thus exhibiting greater homogeneity in the overall reaction temperature. Other advantages for using microwave technology are: 1) reactions can be conducted at normal pressure and the boiling point of the solvent, 2) nanoparticles with a diameter of a few nanometers can be prepared, 3) dramatic decrease in reaction times, 4) improved product purity, 5) all forms of precursors can be used, and 6) it exhibits high reproducibility and high yields.

The present inventors have invented methods, and resulting materials, of preparing $CuInS_2$ and other, for example CuIn-GaS$_2$ alloy, nanoparticles via microwave irradiation from SSPs. The preferred single-source precursor, and microwave-assisted preparations of the present invention provide simple, low temperature, low (preferably ambient) pressure, and short duration preparations that allow excellent control of size and quality of chalcopyrite nanoparticles.

The properties of for example, $CuInS_2$ semi-conductor nanoparticles make them attractive materials for use in next-generation photovoltaics. In one embodiment the present invention, $CuInS_2$ nanoparticles have been prepared from single source precursor via microwave irradiation. Microwave irradiation methods have allowed an increase in the efficiency of preparation of these materials by providing increased uniformity of heating and shorter reaction times. Nanoparticle growth has been controlled in the about 1 to 5 nm size range by variation of thiolated capping ligand concentrations as well as reaction temperatures and times. Investigation of the photophysical properties of the colloidal nanoparticles has been performed using electronic absorption and luminescence emission spectroscopy. Qualitative nanoparticles sizes have been determined from the photoluminescence (PL) data and compared to TEM images.

The present invention comprises methods of producing chalcopyrites, preferably nanoparticles of chalcopyrites. The present invention may also comprise said nanoparticles of chalcopyrites, and/or apparatus comprising said nanoparticles of chalcopyrites. In the preferred methods, preparation of chalcopyrite nanoparticles using a single molecular source ("single-source precursors" (SSP)) in solution phase is performed, with said methods resulting in nanoparticles in the range of less than 10 nm size, for example, less than 10 nm down to smaller than 2 nm, for example.

The preferred methods comprise the use of microwave radiation to decompose said single-source precursors preferably in the presence of alkylthiol ligands in solvent, producing chalcopyrite nanoparticles that exhibit properties expected for chalcopyrite nanoparticles such as room-temperature fluorescence. In preferred embodiments, colloidal chalcopyrite nanocrystals of the formula $CuInS_2$ have been produced by microwave-assisted decomposition of the single-source precursor $(PR_3)_2CuIn(SEt)_4$ (R=Phenyl, Alkyl) in the presence of alkylthiol ligands in dioctyl phthalate as a solvent. In other embodiments, alloys such as $CuInGaS_2$ have also been made.

Using embodiments of the invention, chalcopyrite nanoparticles have been produced at dramatically lower reaction temperatures and shorter reaction times compared to conventional thermolysis techniques, and with the added benefit that chalcopyrite nanoparticles of smaller diameter are achievable than in said conventional thermolysis techniques. For example, nanoparticle formation according to some embodiments of the invention has been observed at temperatures as low as 125 degrees C. at five minutes of microwave irradiation. Good control over nanoparticle size and quality may be achieved by being able to better control of the reaction temperatures, times, and concentrations compared to prior art chalcopyrite particle formation. Control such as the preferred methods offer is believed to be necessary in order to produce high quality nanoparticles of polydispersity. Further, the invented methods allow nanoparticles to be processed further, that is, after their initial formation, in a low-temperature setting.

Embodiments of the invention may result in materials for, and more efficient ways of producing, photovoltaic materials and devices. Nanoparticles according to embodiments of the invention may be used alone as components in photovoltaic devices or may be used as precursors to thin film cells.

DETAILED DESCRIPTION OF THE PREFERRED EMBODIMENTS

Referring to the Figures, and to the Examples and discussion below, there are shown several, but not the only, embodiments, of the invention. In the preferred embodiments, preparation of chalcopyrite nanoparticles, preferably $CuInSe_2$, are accomplished using a single molecular source ("single-source precursors" (SSP)) rather than multiple compounds to contribute elements of the product chalcopyrite. Thus, a single source precursor is used in the preferred methods to obtain all elements in the resulting chalcopyrite nanoparticle; for example, a single-source precursor is used to obtain all the elements (Cu, In, Se) in $CuInSe_2$.

The preferred methods are accomplished in solution phase, at low temperature and low pressure, such as may be provided inside a simple microwave. The preferred methods use microwave radiation to decompose said single-source precursors preferably in the presence of alkylthiol ligands in solvent. The preferred methods result in nanoparticles in the range of less than 10 nm size, for example, less than 10 nm and down to about 1-5 nm. However, by varying concentrations and conditions of the process of manufacture, other particle diameters may be obtained, from nm up to micron size. It is envisioned that nanoparticles of less than 10 nm may be beneficial in many photovoltaic devices.

In preferred embodiments, colloidal chalcopyrite nanocrystals of the formula $CuInS_2$ have been produced by microwave-assisted decomposition of the single-source precursor $(PR_3)_2CuIn(SEt)_4$ (R=Phenyl, Alkyl) in the presence of alkylthiol ligands in dioctyl phthalate as a solvent.

A variety of chalcopyrite nanoparticle sizes may readily be prepared, according to various embodiments of the invention, by varying the following parameters, for example: the concentration of single source precursor (SSP), the concentration of thiol, the temperature ramp times, the final temperature, the hold times, and the microwave wattage. By judiciously changing these parameters, it is believed that virtually any diameter of nanoparticle from the sub 10 nm range up to the μm range may be produced.

In general, the diameters of the nanoparticles produced according to embodiments of the invention increase with increased concentrations of SSP, diameters decrease with increasing concentration of thiol (acting as a pacifying layer), and diameters increase with increasing reaction temperatures and times. Varying the phosphine group on the SSP also allows the decomposition temperature to be varied as well as the stability of the SSP.

Concentrations of SSP between 0.001 M to 0.1 M have been used in embodiments of the invention to produce nanoparticles. Increasing SSP concentration increased the particle diameters. Optimum concentrations of SSP in the inventors' studies have been between 0.033 M to 0.1M. (See Table II, below, for examples of thiol concentration effect on particle sizes.) Increases of thiol concentrations are believed to decrease the particle sizes due to pacifying the surface of the particle.

The inventors have successfully produced nanoparticles, according to embodiments of the invention, using microwave powers in the 200-800 watts range, for example. Powers above 800 watts are expected to also be successful. Higher microwave power output is needed in order to heat reaction solvents to the target ramp temperature as the solvent's polarity decreases. Microwave power output in the range of 500-800 watts is usually required when ramping the temperature. Higher power is required for shorter desired ramp times. After reaching the desired hold temperature, the required power is minimal (usually cycling between 0-300 watts). Increasing microwave power is believed to be more prominent in heating the SSP than in heating the solvent because of the higher polarity of SSP in comparison to most solvents used. Due to this, power applied during the initial ramp power is expected to affect the quality of seed crystal formation.

Reaction temperature between 140° C. to 190° C., achieved by the microwave radiation, are particularly effective when producing nanoparticles in the about 1-100 nm range. Increasing nanoparticle diameters occur with increasing temperature. See Table III, below, for an example of temperature effects on particle size.

Microwave exposure times usually range between 10-30 minutes. Larger nanoparticle diameters occur with increased reaction times, and, hence, with increased microwave exposure times.

EXPERIMENTAL SECTION

Materials

All reagents are commercially available and were obtained in the highest purity from either Aldrich or Acros. Dioctyl phthalate (DOP) (99+%) was passed through a celite and silica gel plug followed by treatment with activated molecular sieves to remove any residual moisture. Hexanethiol was used without further purification as a capping agent to pacify the surface of nanoparticles produced.

Instrumentation

Powder X-ray diffraction (XRD): XRD patterns were acquired with a Rigaku Ultima III diffractometer using $CuK_\alpha$ radiation, a graphite monochromator and a scintillation detector. Scans were collected for 3 h employing a 0.06° step width at a rate of 10 s/step resulting in a 2θ scan range from 2-70°.

High-resolution transmission electron microscopy (HR-TEM): HRTEM data were acquired at the Northwest National Laboratory (PNNL) on a JEOL 2010 high resolution TEM with a spatial resolution of 0.194 nm.

UV-vis: A Shimadzu UV-2101 PC scanning spectrometer was used to take UV-vis measurements at room temperature. UV-visible measurements were collected from solutions prepared in DOP. NMR data were collected using a Varian 300 MHz instrument. The instrument was calibrated for $P^{31}$ NMR using 85% phosphoric acid.

Photoluminescence: Photoluminescence spectra were obtained from a Perkin-Elmer luminescence spectrophotometer model LS50B at room temperature. Luminescence measurements were collected from solutions prepared in DOP.

EDS: The EDS measurements were performed on a Leo Model 1430-VP SEM with an Oxford Model 7353 EDS attachment employing Inca Software.

Microwave reactions: A Milestone Microwave Labstation Terminal 320 was used with a 10 min 500 watt ramp to 140-170° C. and a 10-20 min hold at constant temperature.

SSP Preparation

Example 1

Preparation of [P(i-But)$_3$]$_2$CuIn(SEt)$_4$ Single Source Precursor (SSP 1)

Inert atmosphere techniques and anhydrous conditions were applied to the 5preparation of SSPs. All glassware was either flame dried or oven dried and flushed with nitrogen before use. The reactions and the purification processes were performed under a dry nitrogen atmosphere.

In a flame dried 500 ml three neck flask, 60 ml of anhydrous methanol was added followed by 30 wt % NaOMe (1.85 ml, 9.68 mmol) in MeOH and EtSH (0.75 ml, 9.68 mmol) resulting in a reddish solution. InCl$_3$ (532 mg. 2.42 mmol) was added to the reaction mixture and the solution was stirred for 15 min A solution of CuCl (237 mg, 2.42 mmol) and P($_i$-But)$_3$ (1.22 ml, 4.84 mmol) was prepared in CH$_3$CN and added to the reaction resulting in a pale green solution. The reaction mixture was further stirred for up to 24 h.

Upon completion, solvent was removed in vacuo and dry hexane was added under N$_2$ to precipitate NaCl salt. Under N$_2$, the mixture was filtered over a cake of celite. The resulting filtrate was concentrated to 1.85 g (92.5%) of pale-yellow oil. The resulting oil was used without further purification for the preparation of CuInS$_2$ nanoparticles. P$^{31}$ NMR (CDCl$_3$) δ:53.17, s; H$^1$ NMR (CDCl$_3$) δ: 1.02 (36H, d, J=6.6 Hz), 1.09 (12H, d, J=6.6 Hz), 1.30 (6H, m). 1.64 (8H, q, J=7.8 Hz), 2.74 (12H, t, J=7.2 Hz).

Example 2

Preparation of (PPh$_3$)$_2$ CuIn(SEt)$_4$ Single Source Precursor (SSP 2)

In a flame dried 500 ml three neck flask, 60 ml of anhydrous methanol was added followed by 4.5 ml (23 mmol) of 30 wt % NaOMe in MeOH and 2.2 ml (29 mmol) EtSH resulting in a reddish solution. InCl$_3$ 1.3 g (5.8 mmol) was added to the reaction mixture and the solution was stirred for 15 min. A solution of CuCl 0.57 g (5.8 mmol), and PPh$_3$ 3.1 ml, (16 mmol) in 60 ml of CH$_3$CN was added to the reaction mixture resulting in a pale green solution. The reaction mixture was further stirred for up to 24 h.

Upon completion, solvent was removed in vacuo and anhydrous benzene was added under N$_2$ to precipitate NaCl salt. The solution was collected by syringe and the solvent was removed under vacuum. A light yellow solid was obtained (4.45 g, 89%). The resulting solid was used without further purification for the preparation of CuInS$_2$ nanoparticles. P$^{31}$ NMR CDCl$_3$ δ: –155; H$^1$ NMR CDCl$_3$ δ: 1.12 (12H, t, J=6.6 Hz), 2.56 (8H, q, J=6.9, 13.2 Hz), 7.23 (30H, m).

Nanoparticle Synthesis

Example 3

Microwave-Assisted Synthesis of CuInS$_2$ Nanoparticles from SSP 1

In a dry Milestone microwave vessel, 1 ml of 0.033 M solution of SSP 1 in DOP was added followed by addition of varying amounts of hexanethiol (0.01-0.30 ml) (Hexanethiol acts as a surface pacifying ligand, has a relatively high boiling point, and provides excellent solubility in common organic solvents). An additional 20 ml of DOP was added to the microwave vessel and the solution was capped and stirred for 5 min at room temperature to insure a homogeneous solution. The reaction vessel was placed in the Milestone Microwave Labstation and allowed to ramp to 140-170° C. over 10 min followed by isotherm for 10-20 min. Upon completion, the reaction was cooled to room temperature to provide a homogenous colored solution containing CuInS$_2$ nanoparticles.

The resulting nanoparticles were isolated from the colloidal DOP solution by treating each 1 ml of DOP solution with 30 ml of MeOH and chilling to –15° C. for 12-24 h. The resulting nanoparticles were then collected by centrifugation and a MeOH wash. The product was then dried in vacuo to provide dark orange to dark red powder. The resulting products were analyzed by XRD, UV-vis, Photoluminescence spectroscopy, and HRTEM.

Large scale reactions were also performed in the same manner as the previously described procedure. Glass pressure reaction vessels and Milestone microwave vessels of 50 mL or larger can be used in the Milestone Microwave Labstation to provide a large scale synthesis of nanoparticles.

Example 4

Microwave Synthesis of CuInS$_2$ Nanoparticles from SSP 2

Preparation of nanoparticles using SSP 2 was analogous to the procedures described previously. The 3 ml of 0.056 M SSP 2 DOP solution and varying amounts of hexanethiol (0.1-0.8 ml) was mixed in the microwave vessel. Microwave irradiation involved a 10 min ramp and 10 min hold time at 170° C. Analysis and isolation of nanoparticles was performed as described previously.

Results and Discussion

Preparation of Single Source Precursor

Since Hirpo's initial preparation of (PPh$_3$)$_2$CuIn(SEt)$_4$, (Hirpo et al, 1993) several variations for the preparation of SSPs have appeared in the literature, (Banger et al. 2001, 2002) including a convenient one pot process (Banger et al, 2003). In our preparation of SSPs, we wished to incorporate various R' groups into general formula of the precursor, (R$_3$P)$_2$CuIn(SR')$_4$, without purchasing or preparing expensive NaSR'. We generate alkylthiolate species in situ by the use of sodium methoxide in the reaction mixture following a modification of a similar procedure involving sodium ethoxide (Banger et al 2001). Preparation of various SSPs in one pot is performed in a much shorter reaction time than previously reported as depicted in Table I. As an added benefit, we realized significant reduction in cost.

TABLE 1

Example preparation of single source precursors ((R$_3$P)$_2$CuIn(SR')$_4$

| | SSP (R$_3$P)$_2$CuIn(SR')$_4$ | Methods (Yield) |
|---|---|---|
| 1 | R = Ph, R' = Et | A (84%), B (89%) |
| 2 | R = iBu, R' = Et | A (33%), B (93%) |
| 3 | R = iBu, R' = Bu | B (70%) |
| 4 | R = iBu, R' = Hex | B (79%) |

Method A employs commercially available NaSR while Method B employs NaOMe and RSH.

Significant changes in physical state, solubility in organic solvents and ultimately reactivity of the SSPs can be achieved by varying the phosphines and thiolate groups in the SSPs. For example, TGA data showed the decomposition of (PPh$_3$)$_2$CuIn(SEt)$_4$ begins at 236° C. whereas the decomposition of (PBu$_3$), CuIn(SEt)$_4$ begins at 189° C., a difference of 47° (Banger et al. 2002). The solubility and physical states of SSPs also can significantly vary. For example, the solid SSP (PPh$_3$)$_2$CuIn(SEt)$_4$ is most soluble in aromatic hydrocarbons while the liquid SSP (iBu$_3$P)$_2$CuIn(SEt)$_4$ is soluble in all common hydrocarbon solvents.

Fine Control of CuInS$_2$ Nanoparticle Size During Formation

The traditional methods of synthesizing CuInS2 nanoparticles from single source precursors involve thermolysis techniques where SSPs were heated as high as 300° C. for several hours to produce nanoparticles with a wide range of sizes (i.e., from 3-30 nm). More recently, photolysis of a SSP has allowed the preparation of nanoparticles in the ~2 nm size requiring up to 128 h of reaction time (Nairn et al. 2006). Using microwave irradiation, we are able to produce particles with narrower size distribution. In addition, we are able to produce particles of various sizes as large as 50 nm. However, the focus of this study is on demonstrating the ability to selectively produce very small nanoparticles with fine control of their average diameters. With this goal in mind, nanoparticles were produced with sizes ranging from 2.5 to 50 nm in less than 30 mm requiring a reaction temperature as low as 145° C. The average size of these nanoparticles can be readily manipulated within ±0.3 min by precise control of the reaction temperatures and thiol concentrations. On the other hand, when controlling size by varying temperatures alone, we observed similar size variance of individual nanoparticle in ±0.5 nm range.

Synthesis of CuInS$_2$ nanoparticles was performed via microwave irradiation of the 33 mM SSP 2 with a 10 min ramp to 140-170° C. and a 20 min isotherm. This method allowed production of nanoparticles with average diameters of ≦2 nm as evident by the light yellow solutions through ≧5 nm particle for dark red solutions. We also found that by holding the reaction temperature constant at 170° C. and varying the amounts of hexanethiol capping agent we also could control the size of nanoparticles. The size control is evident by visual inspection where the color of the colloidal solutions progress from yellow, orange and to red indicating increasing sizes with decreasing amounts of hexanethiol.

Currently, there is a great interest in production of CuInS$_2$ nanoparticles in the size domain described above. In order to provide particle sizes small enough to exhibit quantum confinement, the Wannier-Mott bulk excitation, particles of CuInS$_2$ should have a radius of 8 nm or smaller. Fine control of these sizes is required in order to provide a narrow size distribution of ≦10% in order to provide the theoretical limit required in an ordered array for quantum dot solar cells (Grisaru et al. 2003). A collection of reviews on this topic is available in a special issue of Physica E (2002), 14, (102) entitled "Nanostructures in Photovoltaics"

X-Ray Diffraction

Upon the preparation of CuInS$_2$ nanoparticles, X-ray diffraction data were obtained with broad, but consistent peaks matching the reference pattern (JCDPS #74-1737). Broadening of diffraction lines was attributed to the small size of nanoparticles. EDS analysis of the nanoparticles confirm the presence of Cu, In, and S in ratios of about 1:1:2. We observed slightly greater sulfur content in some cases which is consistent with the sulfur containing thiol groups pacifying the surface of the nanoparticles.

Optical Spectroscopy

Figure 1A:
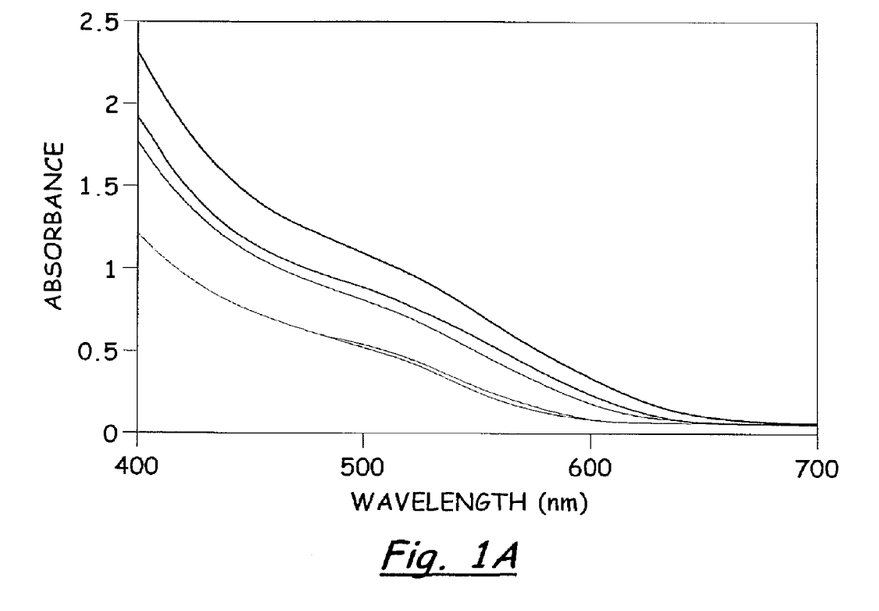
FIG. 1(a) is a UV-vis spectra of precursor 1 for the present invention.
Figure 1B:
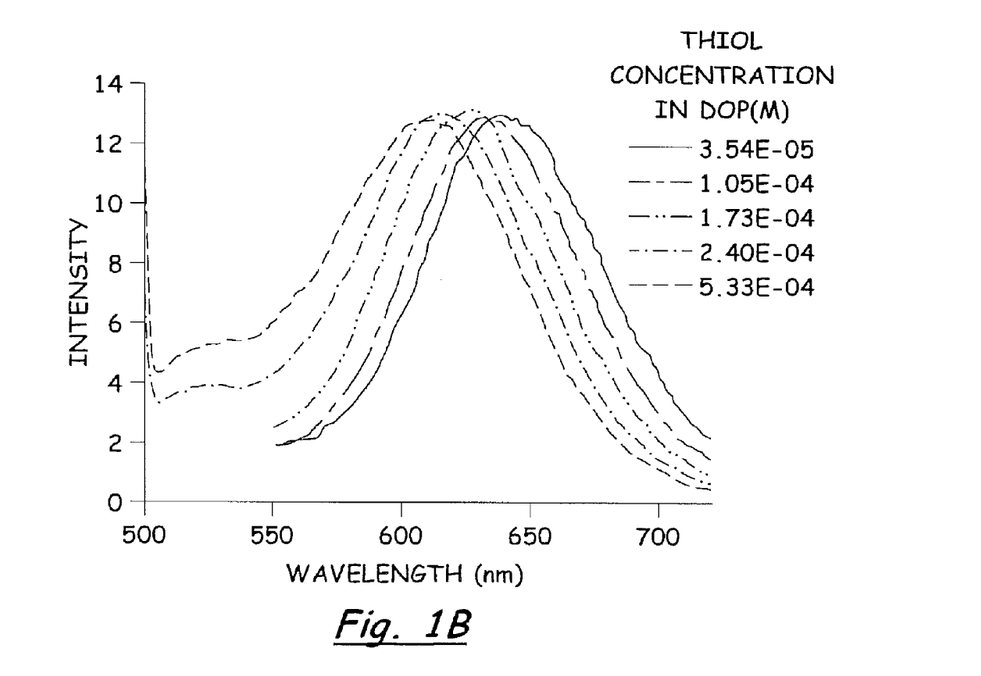
FIG. 1(b) is a photoluminescence spectra of samples according to the present invention made with varying amounts of hexanethiol. These figures show variation of nanoparticle size by thiol concentration.
Figure 2A:
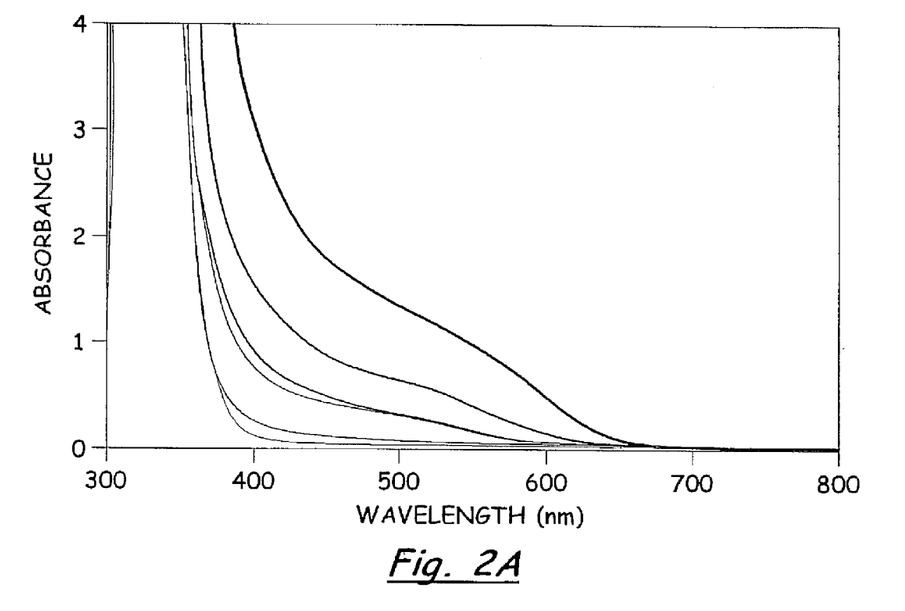
FIG. 2(a) is a UV-vis spectra of colloidal $CuInS_2$ nanoparticle solution prepared from precursor 1 for the present invention.
Figure 2B:
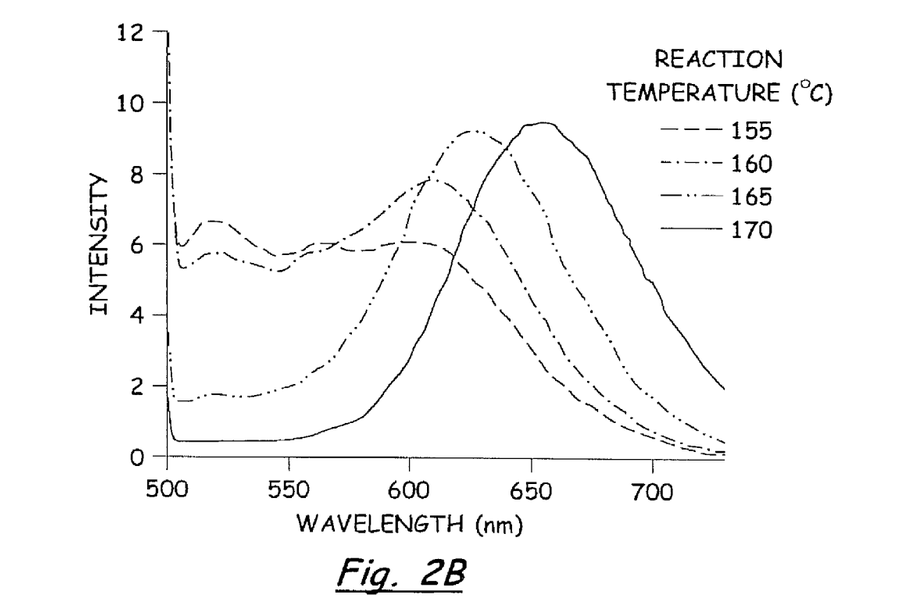
FIG. 2(b) is a photoluminescence spectra of samples according to the present invention made at varying temperatures. These figures show temperature control of nanoparticle sizes.

Neither chemical etching, size-focusing with seed crystals or size selective precipitation was employed on samples before collecting UV-visible, photoluminescence emission (PLE), and TEM data. As shown in FIGS. 1a and 2a, the UV-visible spectra exhibit bathochromic shift of the absorption bands as the nanoparticle sizes increase. We also observe bathochromic shift of PLE with increasing particle size as shown in FIGS. 1b and 2b, which indicates the narrowing of the bandgap in the material as a function of size (Castro et al. 2004). The emission spectra are consistent with particles in the nanometer range while the PLE of bulk CuInS$_2$ occurs at approximately 826 nm. The significance of this change in the observed "bandgap" is that the photophysical properties can be tuned by the size of the nanoparticles in the manner which cannot be achieved by the bulk semiconductor. FIG. 1 (1a and 1b) shows variation of nanoparticle size by thiol concentration. FIG. 1a shows UV-vis spectra of a 11 mM solution of precursor 1 in DOP. FIG. 1b shows photoluminescence spectra, excitation 480 nm, of samples prepared by microwave irradiation of 3 ml of 110 mM SSP with varying amounts of hexanethiol in DOP at 170° C. with a 10 minute ramp and 10 minute hold time. FIG. 2 (2a and 2b) shows variation of nanoparticle size with temperature. FIG. 2a shows UV-vis spectra of colloidal CuInS$_2$ nanoparticle solution from 11 mM SSP solution of precursor 1 in DOP. FIG. 2a shows photoluminescence spectra of nanoparticles prepared by microwave irradiation of 3 ml of 11 mM SSP and 105.0 µM hexanethiol solutions in DOP at varying temperatures with a 10 minute ramp and 20 minute hold time.

The PLE spectral intensities are related to the sample concentration, nature of the pacifying ligand, and surface defects. Emission intensities of CuInS$_2$ nanoparticles have been shown to increase as the particle concentration in solution increases until self-absorption and quenching effects begin to occur (Kalyuzhny 2005). Dilution studies were performed to insure that our CuInS$_2$ concentrations did not involve self quenching Hexanethiol was chosen as the surface pacifying ligand (Castro et al. 2003, 2004) for several reasons. Hexanethiol is an excellent ligand which allows control of the particles size during synthesis and pacifies the surface effectively without the need to exchange surface ligands before collecting PLE spectra. These pacified nanoparticles showed no change in the PLE spectra when stored at 20° C. for over a month. Hexanethiol is also known to provide relatively strong luminescence emission when pacifying CuInS$_2$ nanoparticles in comparison to other ligands (Castro et al. 2004; Zhu et al. 2000).

Emission effects of post synthesis precipitation methods where in agreement with previously reported results, (Wang and Herron 1991) where slightly lower PLE intensities were observed once the particles were redissolved. This phenomenon is attributed to partial loss of the pacifying surface ligand during precipitation and resolution processes.

The PLE maxima can be directly related to the bandgap and average particle size of the nanoparticles with no significant shifts occurring due to exchange of ligands. However, emission maxima are extremely dependent on reaction conditions. A bathochromic shift of PLE indicates increased particle size and decreased bandgap which eventually approach the bulk material at 826 nm (Bandgap ~150 eV). We observe the increased particle size and corresponding spectral data in our samples when reaction times are increased, reaction temperature is increased, and/or the amount of hexanethiol is decreased.

According to the previously reported thermolysis data, $CuInS_2$ nanoparticles in our size regime have exhibited emission widths of 150-200 nm and are unchanged even after size selective precipitation (Castro et al. 2004). In $CuInS_2$ systems, the nature of the surface pacifying ligands do not appear to have a significant affect on the width or shape of the emission peak. Although sharp emission peak widths generally indicate narrow polydispersity, in ternary systems such as $CuInS_2$ there are many contributing factors which can cause broadening of emission peaks. For example, a number of closely spaced emission bands resulting from the increased complexity of the bandgap for the ternary material may cause a broad emission peak. Another possible source for broadening is excess Cu or In in the lattice, which can result in shoulders on the main emission spectra. Shoulders on the emission spectra have previously been attributed to bimodal distributions of polydisperse particle sizes, photophysics effects, and/or surface defects resulting in ratios varying from 1:1:2 Cu:In:S on the particle surface (Castro et al. 2004).

As mentioned previously, the size can be controlled by varying the concentration of the thiol, by the temperature, and by the microwave irradiation time. Our samples give emission peaks which are slightly narrower in the thiol concentration studies (~175 nm) than that of the temperature studies (~200 nm), which suggests that ligand concentration has a greater influence in size control. However quantification of the polydispersity is still obscured by the multiple emission lines from the ternary system and is better determined by HRTEM data.

Nanoparticle Size Determination
Calculated Sizes from Photoluminescence Data

Photoluminescence data can be used to estimate nanoparticle radii/diameters using a well established method (Wang and Herron 1991). In our studies, the samples are consistently overestimated in particle diameter size when compared with HRTEM data.

The results of nanoparticle synthesis involving varied amounts of hexanethiol are represented in Table 2. As mentioned previously, varying particle sizes are observed as we vary the concentration of hexanethiol as indicated by changes in PLE $\lambda_{max}$. Using PLE $\lambda_{max}$ data, nanoparticle diameters have been calculated using Wang and Herron's method, above. Relative bandgaps have also been calculated. Both sets of data indicate a clear trend showing the increasing hexanethiol in the reaction resulting in increasing bandgaps and decreasing particle sizes. This same general trend is also observed in the corresponding HRTEM data.

TABLE 2

Variation of nanoparticles by thiol concentrations

| Sample | Hexanethiol concentration in DOP (M) | Color of nanoparticle solution | PLE $\lambda_{max}$ (nm) | Calculated bandgap (eV) | Calculated diameters (nm) | HRTEM diameters (nm) |
|---|---|---|---|---|---|---|
| 1 | $3.54 \times 10^{-5}$ | Dark, dark red | 640.5 | 1.94 | 4.9 | 4.1 ± 0.7 |
| 2 | $1.05 \times 10^{-4}$ | Dark red | 636.5 | 1.95 | 4.8 | 5.2 ± 2.9[a] |
| 3 | $1.73 \times 10^{-4}$ | Red | 631.0 | 1.96 | 4.7 | 3.6 ± 1.3 |
| 4 | $2.40 \times 10^{-4}$ | Dark orange | 614.5 | 2.02 | 4.5 | 3.1 ± 0.5 |
| 5 | $5.33 \times 10^{-4}$ | Orange | 613.0 | 2.02 | 4.4 | [b] |

Figure 4:
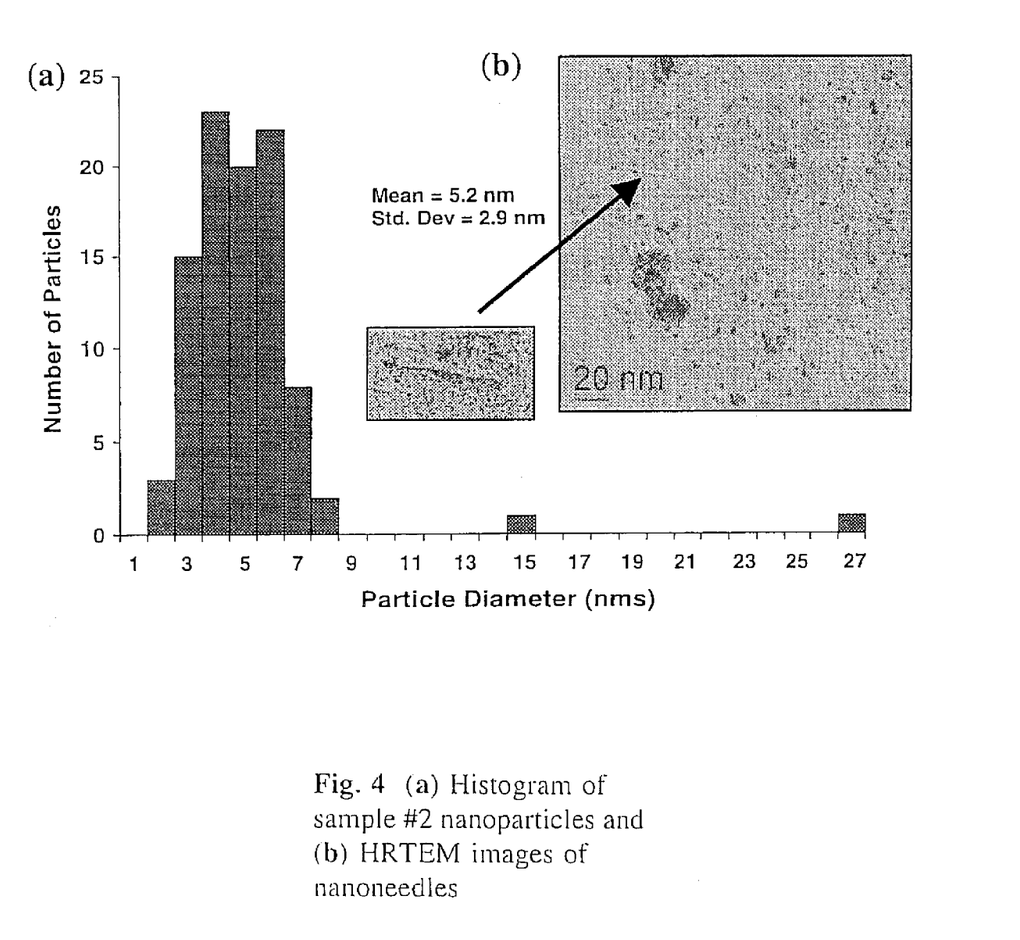
FIG. 4(a) is a histogram of particle sizes according to the invention.
FIG. 4(b) is a high resolution TEM of the sample from which the histogram of FIG. 4(a) was developed.

DOP solution of SSP ($3.3 \times 10^{-2}$ M) with a 10 min ramp and 10 min hold at 170° C.
[a]Nanoparticles in sample 2 contain a mixture of morphologies (see discussion on FIG. 4)
[b]Due to poor resolution of HRTEM, the accurate size could not be obtained.

The results of nanoparticle synthesis involving varied reaction temperatures are represented in Table 3. Again, we observe increasing particle size as the reaction temperatures are increased. Nanoparticle diameters and relative bandgaps were calculated showing good correlation between bandgaps and particle sizes.

TABLE 3

Variation of nanoparticle size with temperature

| Sample | Temperature (° C.) | Color of nanoparticle solution | PLE $\lambda_{max}$ (nm) | Calculated bandgap (eV) | Calculated diameters (nm) | HRTEM diameters (nm) |
|---|---|---|---|---|---|---|
| 6 | 170 | Dark red | 656.5 | 1.89 | 5.2(4.5)[a] | 4.5 ± 0.5 |
| 7 | 165 | Red | 629.0 | 1.97 | 4.7[3.7][a] | — |
| 8 | 160 | Dark orange | 608.5 | 2.04 | 4.4[3.2][a] | — |
| 9 | 155 | Orange | 603.5 | 2.05 | 4.3[3.0][a] | 3.0 ± 0.5 |

DOP solution of SSP ($3.3 \times 10^{-2}$ M) and hexanethiol $1.05 \times 10^{-4}$ M with a 10 min ramp and 20 min hold
[a]TEM corrected nanoparticle diameters [ ]

High Resolution Transmission Electron Microscopy

Figure 3:
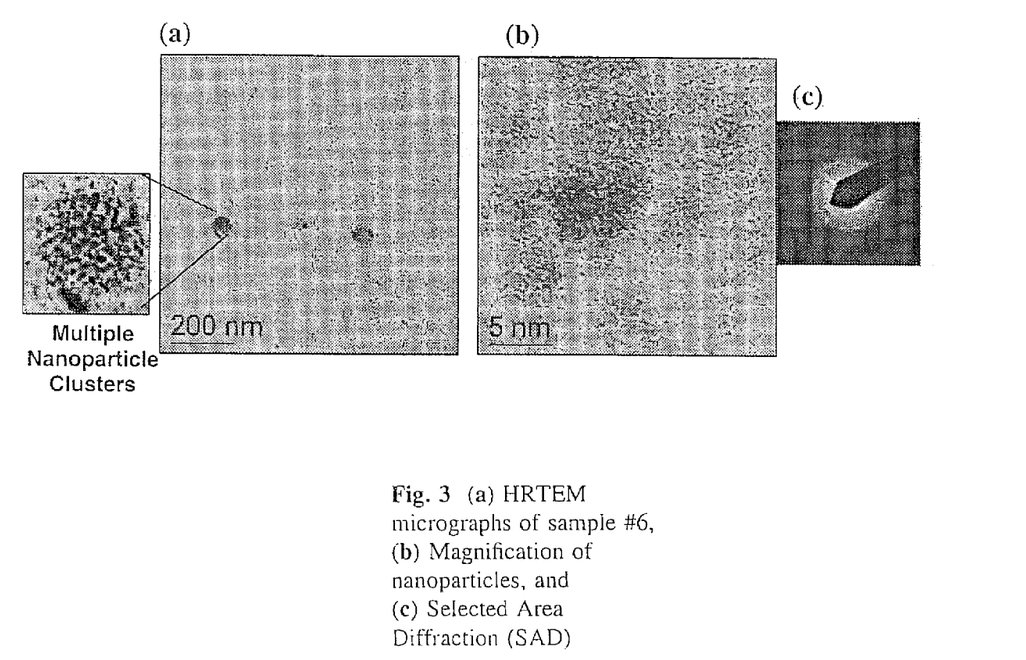
FIGS. 3(a) and 3(b) are high resolution transmission electron microscopy (HRTEM's) of samples prepared according to the invention.
FIG. 3(c) is a selected area electron diffraction (SAD) pattern of the same sample.

HRTEM micrographs (FIGS. 3a, b) reveal small particles with a narrow distribution of particle sizes in the 4.5±0.5 nm particle range for sample 6. The darker spots observed in FIG. 3a (see inset) are clusters containing many nanoparticles. These clusters likely occur during treatment of the DOP solutions with methanol during the precipitation process. The particles being produced by these reactions are crystalline in nature as shown by the inset Selected Area Diffraction (SAD) concentric ring diffraction patterns in FIG. 3c. Additional HRTEM micrographs reveal that samples 6 and 9 indicate decreasing size with decreasing reaction temperatures. Sample 9 with a 155° C. reaction temperature provides particle size of 3.0±0.5 nm, whereas sample 6 with a reaction temperature of 170° C. provides particle size of 4.5±0.5 nm.

The HRTEM micrographs from the temperature study allowed us to estimate our particle sizes and distributions as shown in Tables 2-3. Corrections have been made to the calculated diameters shown in the Table 3 (presented in [ ]) based on our average sizes observed in the HRTEM micrographs using linear regression which provides more accurate calculated diameters of the nanoparticles. This correction indicates approximately 1 nm overestimation using Wang and Herron's method, above.

Only spherical particles were observed in the HRTEM images of particles produced from temperature controlled synthesis. Spherical particles may be formed due to heat based annealing of surface defects during the particle growth process with longer reaction time of 20 min. Whereas, when shorter reaction times of 10 nm were used, more than one morphology was observed as shown in FIG. 4. When looking at spherical particles only, a mean of 5.2 nm diameter particles was observed with a standard deviation of 2.9 nm (see histogram in FIG. 4a). This large deviation is much higher than that which is observed from the temperature controlled studies (±0.5 nm diameter deviations). This is due to a few scattered larger particles and non-spherical morphologies observed in the micrograph.

These non-spherical particles with a needle like morphology consisting of uniform 2 by 20 nm dimensions were seen throughout the sample (see FIG. 4b magnification). Slightly elliptical morphologies of ternary $CuInS_2$ particles with roughly 2 nm dimensions have been previously produced under photolysis conditions (Shapiro 2005). In addition, $CuInS_2$ particles in roughly the 50-185 nm range have also been reported with various exotic morphologies such as acorn, bottle, and larva shapes (Choi et al. 2006). We are currently attempting to selectively produce these needle like particles for further analysis.

CONCLUSIONS

There are several advantages of using microwave irradiation to prepare $CuInS_2$ nanoparticles. Uniform heating of reaction vessels of various sizes and reduced thermal gradients compared to thermolysis methods provide high quality nanoparticles. Furthermore microwave assisted reactions can readily be scaled up using conventional reaction vessels. We have shown that a variety of nanoparticles diameters about 1-5 nm can be prepared with a narrow distribution of sizes. Short reaction times of 30 min or less are required for the preparation of these nanoparticles compared to traditional thermolysis requiring up to several hours at higher temperatures. Controlled variation in the reaction temperature, thiol concentration, and heating time allowed for fine control of the particle size and morphology. Additionally during these studies we were able to improve the preparation of copper-indium-sulfur containing molecular single source precursors of $CuInS_2$ in terms of preparation time and cost.

Although this invention has been described above with reference to particular means, materials, and embodiments, it is to be understood that the invention is not limited to these disclosed particulars, but extends instead to all equivalents within the scope of this Description and the Figures as expressed in the following Claims.

What is claimed is:

1. A method for adjusting the size of chalcopyrite nanoparticles which
   comprises microwave irradiation of a single source precursor in the presence of alkylthiol,
   and
   increasing the alkythiol concentration to decrease particle size, or decreasing the alkythiol concentration to increase particle size.

2. A method for adjusting the size of chalcopyrite nanoparticles which
   comprises microwave irradiation of a single source precursor,
   and
   increasing the temperature of the precursor as a result of the microwave irradiation to increase the size of the nanoparticles, or decreasing the temperature to decrease the size of the nanoparticles.

* * * * *